(12) United States Patent
Lee

(10) Patent No.: US 8,382,555 B2
(45) Date of Patent: Feb. 26, 2013

(54) SUBSTRATE SUPPORTING UNIT, AND APPARATUS AND METHOD FOR POLISHING SUBSTRATE USING THE SAME

(75) Inventor: Taek Youb Lee, Cheonan-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 634 days.

(21) Appl. No.: 12/591,246

(22) Filed: Nov. 13, 2009

(65) Prior Publication Data

US 2010/0130105 A1 May 27, 2010

(30) Foreign Application Priority Data

Nov. 26, 2008 (KR) .................. 10-2008-0118105

(51) Int. Cl.
*B24B 1/00* (2006.01)
(52) U.S. Cl. ........................................ 451/41
(58) Field of Classification Search ............ 451/41, 451/285–290, 388
See application file for complete search history.

(56) References Cited

U.S. PATENT DOCUMENTS

| | | | | |
|---|---|---|---|---|
| 6,164,633 | A * | 12/2000 | Mulligan et al. | 269/21 |
| 6,822,730 | B2 * | 11/2004 | Krikhaar et al. | 355/72 |
| 8,113,918 | B2 * | 2/2012 | Koo et al. | 451/67 |
| 2003/0211813 | A1 * | 11/2003 | Kassir et al. | 451/28 |
| 2004/0052031 | A1 * | 3/2004 | Krikhaar et al. | 361/234 |
| 2005/0041234 | A1 * | 2/2005 | Krikhaar et al. | 355/72 |
| 2008/0052948 | A1 * | 3/2008 | Kim et al. | 34/317 |
| 2008/0061519 | A1 * | 3/2008 | Cho et al. | 279/106 |
| 2009/0325469 | A1 * | 12/2009 | Koo et al. | 451/54 |

FOREIGN PATENT DOCUMENTS

| | | |
|---|---|---|
| CN | 1591816 | 3/2005 |
| JP | 51-36375 | 10/1976 |
| JP | 06-097269 | 4/1994 |
| JP | 09-174420 | 7/1997 |
| JP | 10-284448 | 10/1998 |
| JP | 11-040492 | 2/1999 |
| JP | 2000-208591 | 7/2000 |
| JP | 2002-353181 | 12/2002 |
| JP | 2003-332410 | 11/2003 |
| JP | 2005-085881 | 3/2005 |
| JP | 2005-191557 | 7/2005 |
| JP | 2007-142267 | 6/2007 |
| JP | 2009-076918 | 4/2009 |
| JP | 2010-012591 | 1/2010 |
| KR | 2001-043741 | 5/2001 |
| KR | 10-2003-0053980 | 7/2003 |
| KR | 2008-071679 | 8/2008 |

* cited by examiner

*Primary Examiner* — Maurina Rachuba
(74) *Attorney, Agent, or Firm* — Harness, Dickey & Pierce, P.L.C.

(57) ABSTRACT

Provided are a substrate supporting unit and an apparatus and method for polishing a substrate using the same. The substrate supporting unit vacuum-absorbs a bottom surface of the substrate during a polishing process, and supports the substrate in a state where the substrate is upwardly spaced from the substrate supporting unit to clean the substrate during a post-cleaning process. Therefore, in the substrate supporting unit and the apparatus and method for polishing the substrate using the same, a polishing process on a top surface of the substrate and a post-cleaning process on the top and bottom surfaces of the substrate may be sequentially performed in a state where the substrate is supported by a single wafer type substrate supporting unit.

15 Claims, 13 Drawing Sheets

SUBSTRATE SUPPORTING UNIT, AND APPARATUS AND METHOD FOR POLISHING SUBSTRATE USING THE SAME

CROSS-REFERENCE TO RELATED APPLICATIONS

This U.S. non-provisional patent application claims priority under 35 U.S.C. §119 of Korean Patent Application No. 10-2008-0118105, filed on Nov. 26, 2008, the entire contents of which are hereby incorporated by reference.

BACKGROUND

The present disclosure herein relates to an apparatus and method of manufacturing a semiconductor, and more particularly, to a substrate supporting unit supporting a semiconductor substrate in a single wafer processing manner and a substrate polishing apparatus for polishing and cleaning a substrate using the same.

In a general semiconductor device manufacturing process, a plurality of unit processes such as a deposition process, a photolithography process, and an etch process should be repeatedly performed to form and stack a thin film. These processes are repeated until desired predetermined circuit patterns are formed on a wafer. After the circuit patterns are formed, many curvatures are formed on a surface of the wafer. As semiconductor devices are now highly integrated and also multilayered in structure, the number of curvatures on a surface of a wafer and a height difference between the curvatures increase. As a result, due to the non-planarization of the surface of the wafer, defocus may occur in a photolithography process. Thus, to realize the planarization of the surface of the wafer, the wafer surface should be periodically polished.

Various surface planarization techniques have been developed for planarizing the surface of the wafer. Among these, a chemical mechanical polishing (CMP) technique is widely used because wide surfaces as well as narrow surfaces may be planarized with good flatness by using the CMP technique. A CMP apparatus is used to polish the surface of the wafer coated with tungsten or an oxide by using mechanical friction and chemical abrasives, and very fine polishing is possible using the CMP apparatus.

SUMMARY OF THE INVENTIVE CONCEPT

Embodiments of the inventive concept provide a substrate supporting unit in which a substrate polishing process and a post-cleaning process are sequentially performed in a single wafer processing manner, and an apparatus and method for polishing a substrate using the same.

Objects of the inventive concept are not limited to those mentioned above, and other objects of the inventive concept will be apparently understood by those skilled in the art through the following description.

Embodiments of the inventive concept provide substrate supporting units including: a vacuum plate vacuum-absorbing a substrate; chuck members inserted into holes passing through the vacuum plate; and a driving member vertically moving the chuck members to support the substrate placed on the vacuum plate in a state where the substrate is spaced upwardly from the vacuum plate.

In some embodiments, the driving member may include: an upper magnet member coupled to the chuck members; a lower magnet member in which a magnetic pole thereof is oriented such that a magnetic repulsive force acts between the upper and lower magnet members, the lower magnet member being disposed below the upper magnet member to face each other; and a linear driving unit vertically moving the lower magnet member.

In other embodiments, the chuck members may include supporting pins supporting a bottom surface of the substrate and chucking pins supporting a lateral surface of the substrate.

In still other embodiments, the upper magnet member may include a first upper magnet member coupled to the supporting pins and a second upper magnet member coupled to the chucking pins.

In even other embodiments, the lower magnet member may include: a first lower magnet member in which a magnetic pole thereof is oriented such that a magnetic repulsive force acts between the first upper and lower magnet members, the first lower magnet member being disposed below the first upper magnet member; and a second lower magnet member in which a magnetic pole thereof is oriented such that a magnetic repulsive force acts between the second upper and lower magnet members, the second lower magnet member being disposed below the second upper magnet member, wherein the linear driving unit may include: a first linear driving unit vertically moving the first lower magnet member; and a second linear driving unit vertically moving the second lower magnet member.

In yet other embodiments, each of the first and second upper magnet members and the first and second lower magnet members may have a ring shape.

In further embodiments, a plurality of vacuum absorption holes may be defined in a top surface of the vacuum plate, and vacuum lines connecting the vacuum absorption holes to each other may be disposed inside the vacuum plate, wherein the substrate supporting unit may further include: a suction member providing a negative pressure to the vacuum lines to vacuum-absorb the substrate; and a gas supply member supplying a gas to the vacuum lines to prevent a foreign substance from being introduced into the vacuum absorption holes in a state where the substrate is upwardly spaced from the vacuum plate.

In even further embodiments, the substrate supporting units may further include: a hollow-type rotation driving unit rotating the vacuum plate; and a back nozzle assembly inserted into a hollow portion of the rotation driving unit, the back nozzle assembly spraying a cleaning liquid onto a bottom surface of the substrate upwardly spaced from the vacuum plate.

In yet further embodiments, the substrate supporting units may further include a back nozzle driving unit vertically moving the back nozzle assembly such that the back nozzle assembly protrudes from a top surface of the vacuum plate.

In other embodiments of the inventive concept, single wafer type substrate polishing apparatuses include: a process chamber; a substrate supporting unit disposed inside the process chamber, the substrate supporting unit supporting a substrate; a polishing unit polishing the substrate supported by the substrate supporting unit; and a cleaning unit cleaning the substrate supported by the substrate supporting unit, wherein the substrate supporting unit includes: a vacuum plate vacuum-absorbing the substrate; chuck members inserted into holes passing through the vacuum plate; and a driving member vertically moving the chuck members to support the substrate placed on the vacuum plate in a state where the substrate is spaced upwardly from the vacuum plate.

In some embodiments, the driving member may include: an upper magnet member coupled to the chuck members; a lower magnet member in which a magnetic pole thereof is oriented such that a magnetic repulsive force acts between the upper and lower magnet members, the lower magnet member being disposed below the upper magnet member to face each other; and a linear driving unit vertically moving the lower magnet member.

In other embodiments, the chuck members may include supporting pins supporting a bottom surface of the substrate and chucking pins supporting a lateral surface of the substrate.

In still other embodiments, the upper magnet member may include a first upper magnet member coupled to the supporting pins and a second upper magnet member coupled to the chucking pins.

In even other embodiments, the lower magnet member may include: a first lower magnet member in which a magnetic pole thereof is oriented such that a magnetic repulsive force acts between the first upper and lower magnet members, the first lower magnet member being disposed below the first upper magnet member; and a second lower magnet member in which a magnetic pole thereof is oriented such that a magnetic repulsive force acts between the second upper and lower magnet members, the second lower magnet member being disposed below the second upper magnet member, wherein the linear driving unit may include: a first linear driving unit vertically moving the first lower magnet member; and a second linear driving unit vertically moving the second lower magnet member.

In yet other embodiments, the cleaning unit may include: a first cleaning unit disposed at a side of the substrate supporting unit, the first cleaning unit supplying a cleaning liquid onto a top surface of the substrate; and a second cleaning unit inserted into a hollow portion of a hollow-type rotation driving unit rotating the vacuum plate, the second cleaning unit supplying a cleaning liquid onto a bottom surface of the substrate.

In further embodiments, the single wafer type substrate polishing apparatuses may further include a driving member vertically moving the second cleaning unit such that the second cleaning unit protrudes from a top surface of the vacuum plate.

In still further embodiments, the single wafer type substrate polishing apparatuses may further include a gas supply member supplying a gas to a vacuum absorption holes to prevent the cleaning liquid from being introduced into the vacuum absorption holes defined in the vacuum plate during a substrate cleaning process.

In other embodiments of the inventive concept, methods of polishing a substrate using an apparatus of claim 10 include: vacuum-absorbing the substrate onto the vacuum plate to polish a top surface of the substrate; lifting the chuck members to support the polished substrate placed on the vacuum plate in a state where the substrate is upwardly spaced from the vacuum plate; and supplying a cleaning liquid to the polished substrate to clean the substrate.

In some embodiments, the chuck members may include supporting pins supporting a bottom surface of the substrate, and when the supporting pins ascend, the vacuum plate may be rotated at a relatively lower speed when compared to that of the substrate polishing process or stopped.

In other embodiments, the chuck members may further include chucking pins supporting a lateral surface of the substrate, the chucking pins may ascend to support a lateral surface of the substrate supported by the supporting pins, and the vacuum plate may be accelerated at a process speed.

In still other embodiments, the cleaning liquid may be supplied to the top surface and a bottom surface of the polished substrate upwardly spaced from the vacuum plate to clean the top and bottom surfaces of the substrate at the same time.

In even other embodiments, when the bottom surface of the substrate is cleaned, the back nozzle assembly may be vertically moved such that the back nozzle assembly spraying the cleaning liquid protrudes from a top surface of the vacuum plate.

In yet other embodiments, when the cleaning process is performed on the substrate, a gas may be supplied to the vacuum absorption holes to prevent the cleaning liquid from being introduced into the vacuum absorption holes of the vacuum plate.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the figures.

DETAILED DESCRIPTION OF THE EMBODIMENTS

Figure 1:
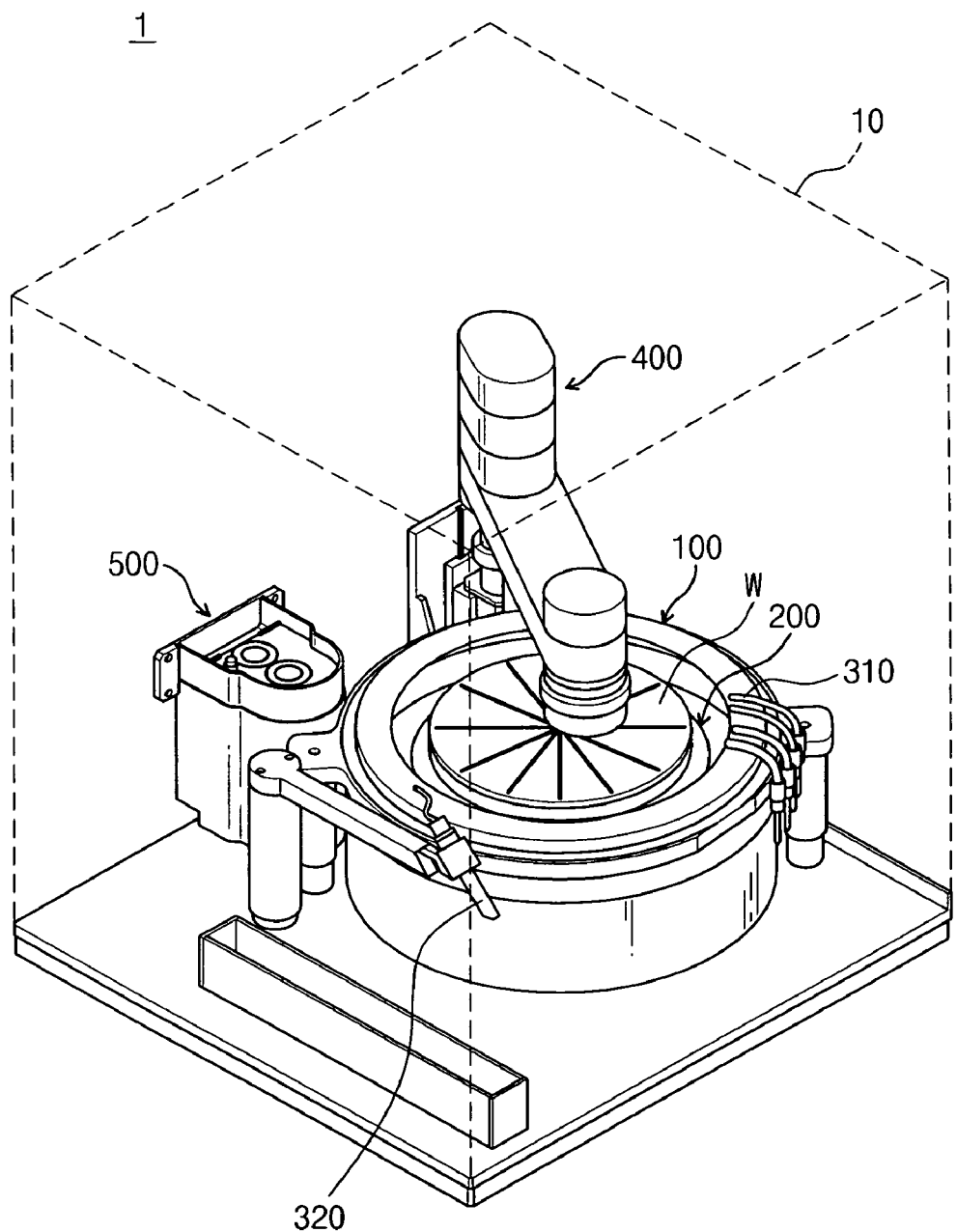
FIG. 1 is a perspective view of a single wafer type substrate polishing apparatus according to the inventive concept.

A substrate supporting unit and a single type substrate polishing apparatus using the substrate supporting unit will now be described below in more detail with reference to the accompanying drawings, in which exemplary embodiments of the invention are shown. In the figures, elements are indicated by reference numerals, and the same or similar elements may be indicated by the same reference numerals. In the following descriptions, well-known structures and functions will not be described in detail to avoid ambiguous interpretation of the inventive concept.

(Embodiment)

Figure 2:
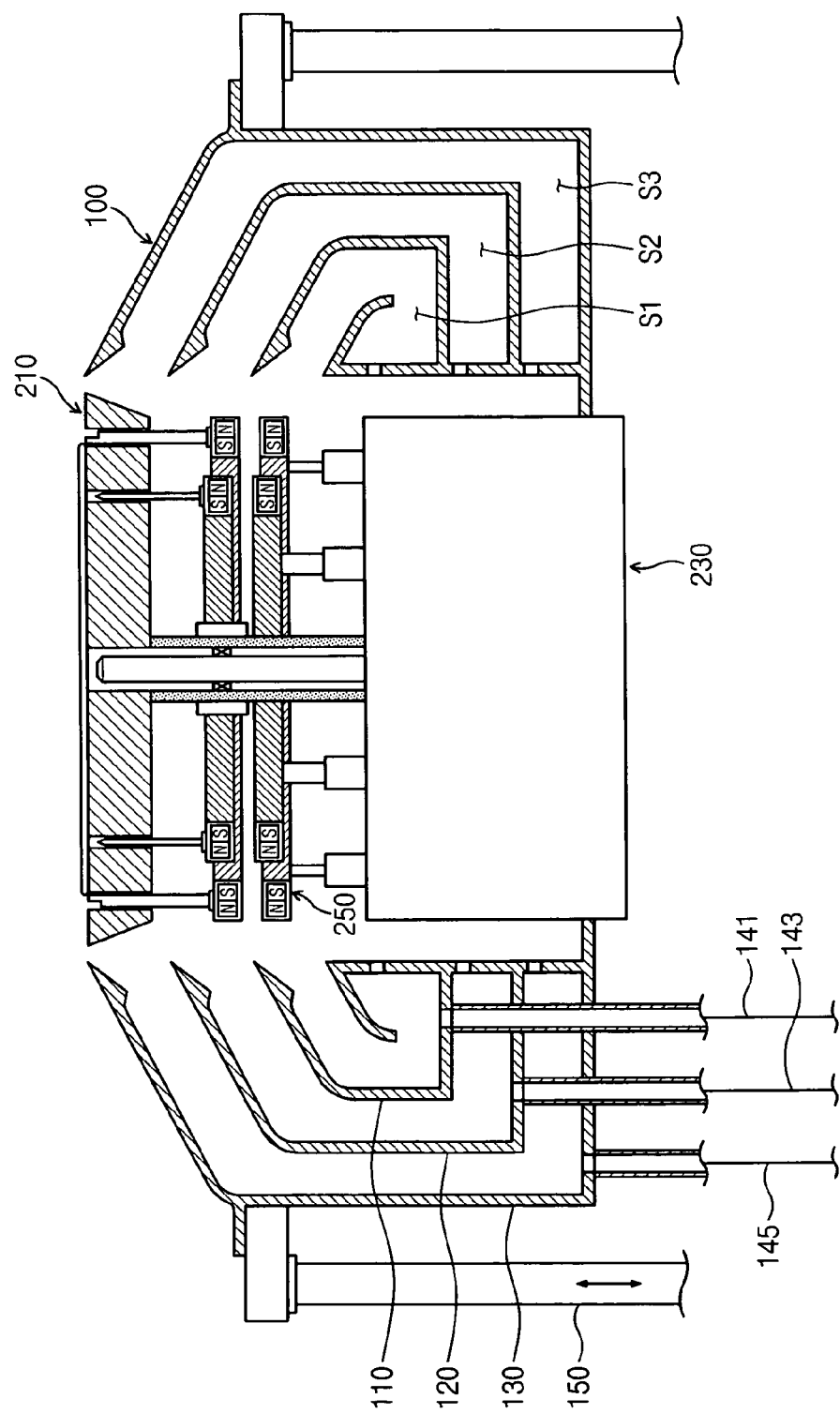
FIG. 2 is a side sectional view of a process bowl and a substrate supporting unit of FIG. 1.

FIG. 1 is a perspective view of a single wafer type substrate polishing apparatus 1 according to the inventive concept, and FIG. 2 is a side sectional view of a process bowl 100 and a substrate supporting unit 200 of FIG. 1.

In the single wafer type substrate polishing apparatus 1 according to the inventive concept, a polishing process on a top surface of a substrate W and a following post-cleaning process on top and bottom surfaces of the substrate W may be sequentially performed in one process chamber 10.

Referring to FIGS. 1 and 2, the single wafer type substrate polishing apparatus 1 according to the inventive concept includes the process bowl 100, the substrate supporting unit 200, cleaning units 310, 320, and 330, a polishing unit 400, and a pad conditioning unit 500.

The process bowl 100 provides a space for processing the substrate W.

The substrate supporting unit 200 is received inside the process bowl 100. The substrate supporting unit 200 fixes the substrate W loaded into the process bowl 100 during the substrate polishing process and the post-cleaning process.

The cleaning units 310 and 320 for cleaning the top surface of the substrate W are disposed at one side of the process bowl 100, and the cleaning unit 330 for cleaning the bottom surface of the substrate W is disposed in the substrate supporting unit 200. After the substrate W is polished by the polishing unit 400, the substrate W is cleaned by the cleaning units 310, 320, and 330. The cleaning unit 310 may be a cleaning liquid supply member configured to supply a cleaning liquid to the top surface of the substrate W, and the cleaning unit 320 may be a supersonic cleaning member configured to apply supersonic waves to the cleaning liquid supplied to the top surface of the substrate W to increase cleaning efficiency. Also, the cleaning unit 330 may be a cleaning liquid supply member configured to supply a cleaning liquid to the bottom surface of the substrate W.

The polishing unit 400 and the pad conditioning unit 500 are disposed at another side of the process bowl 100. The polishing unit 400 chemically and mechanically polishes the top surface of the substrate W. The pas conditioning unit 500 polishes a polishing pad (not shown) of the polishing unit 400 to adjust the surface roughness of the polishing pad.

The process bowl 100 includes first, second, and third recovery vats 110, 120, and 130, which have a cylindrical shape. In this embodiment, the process bowl 100 includes three recovery vats. However, the number of recovery vats may increase or decrease. The first, second, and third recovery vats 110, 120, and 130 recover the cleaning liquid supplied to the substrate W during a substrate processing process. In the substrate polishing apparatus 1, the substrate W is cleaned while it is rotated by the substrate supporting unit 200. Thus, the cleaning liquid supplied to the substrate W may be scattered. The first, second, and third recovery vats 110, 120, and 130 recover the scattered cleaning liquid.

First, second, and third recovery spaces S1, S2, and S3 in which the cleaning liquid scattered from the substrate W is introduced are defined in the first, second, and third recovery vats 110, 120, and 130. The first recovery space Si is defined by the first recovery vat 110 to recover a first cleaning liquid for primarily processing the substrate W. The second recovery space S2 is defined by a space spaced between the first and second recovery vats 110 and 120 to recover a second cleaning liquid for secondarily processing the substrate W. The third recovery space S3 is defined by a space spaced between the second and third recovery vats 120 and 130 to recover a third cleaning liquid for thirdly processing the substrate W.

A first recovery line 141 is connected to the first recovery vat 110. The first cleaning liquid introduced into the first recovery space Si is discharged to the outside through the first recovery line 141. A second recovery line 143 is connected to the second recovery vat 120. The second cleaning liquid introduced into the second recovery space S2 is discharged to the outside through the second recovery line 143. A third recovery line 145 is connected to the third recovery vat 130. The third cleaning liquid introduced into the third recovery space S3 is discharged through the third recovery line 145.

A vertical movement part 150 may be coupled to the process bowl 100 to change a vertical position of the process bowl 100. The vertical movement part 150 is disposed on an outer wall of the third recovery vat 130 to move the process bowl 100 upward and downward while the vertical position of the substrate supporting unit 200 is fixed. Therefore, a relative vertical position between the process bowl 100 and the substrate W may be changed. Accordingly, different cleaning liquids may be recovered into the recovery spaces S1, S2, and S3 of the process bowl 100.

Figure 3:
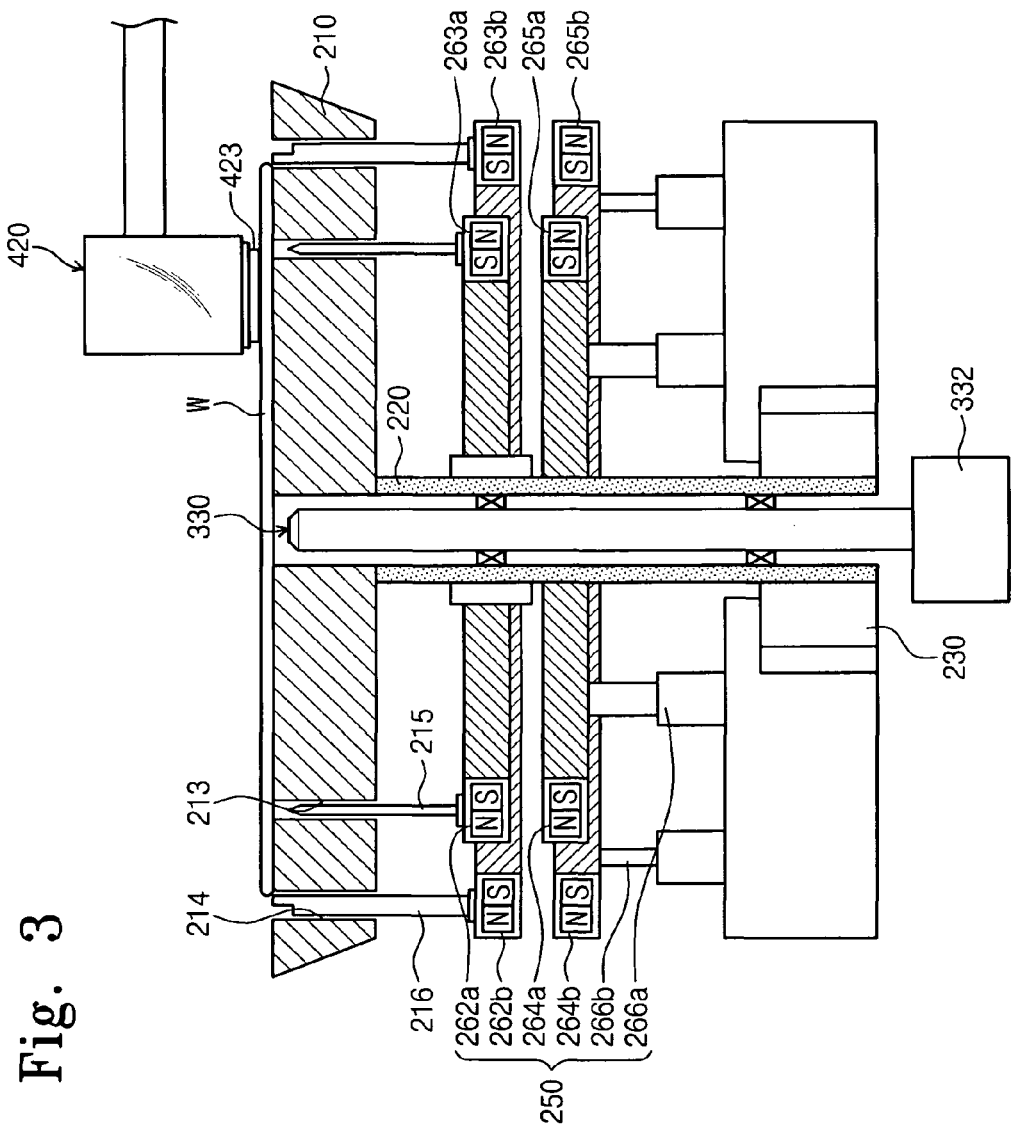
FIG. 3 is a view illustrating a process of polishing a substrate using a substrate supporting unit according to an embodiment of the inventive concept.
Figure 4:
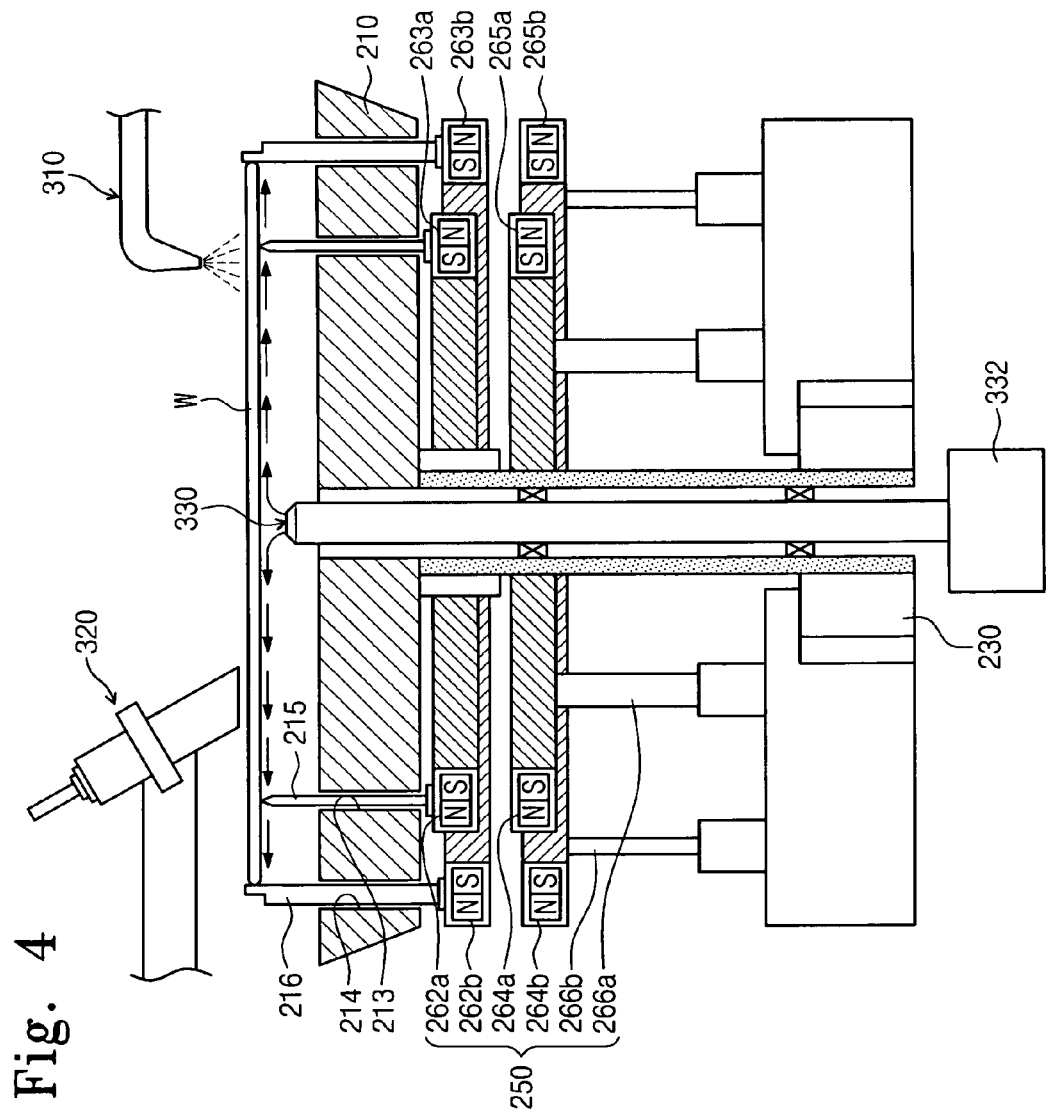
FIG. 4 is a view illustrating a process of cleaning a substrate using the substrate supporting unit according to an embodiment of the inventive concept.

FIG. 3 is a view illustrating a process of polishing a substrate using a substrate supporting unit according to an embodiment of the inventive concept, and FIG. 4 is a view illustrating a process of cleaning a substrate using the substrate supporting unit according to an embodiment of the inventive concept.

Referring to FIGS. 2, 3, and 4, the substrate supporting unit 200 includes a vacuum plate 210, a rotation shaft 220, a rotation driving part 230, and a driving member 260. The substrate supporting unit 200 may be disposed inside the process bowl 100 to support and rotate the substrate W during processing.

As shown in FIG. 3, the vacuum plate 210 supports the substrate W during the substrate polishing process. The rotation shaft 220 is connected to a bottom surface of the vacuum plate 210 and rotated by the rotation driving part 230 connected to a lower end thereof. The rotation shaft 220 may include a hollow shaft. The rotation driving part 230 may include a hollow-type motor.

Figure 5:
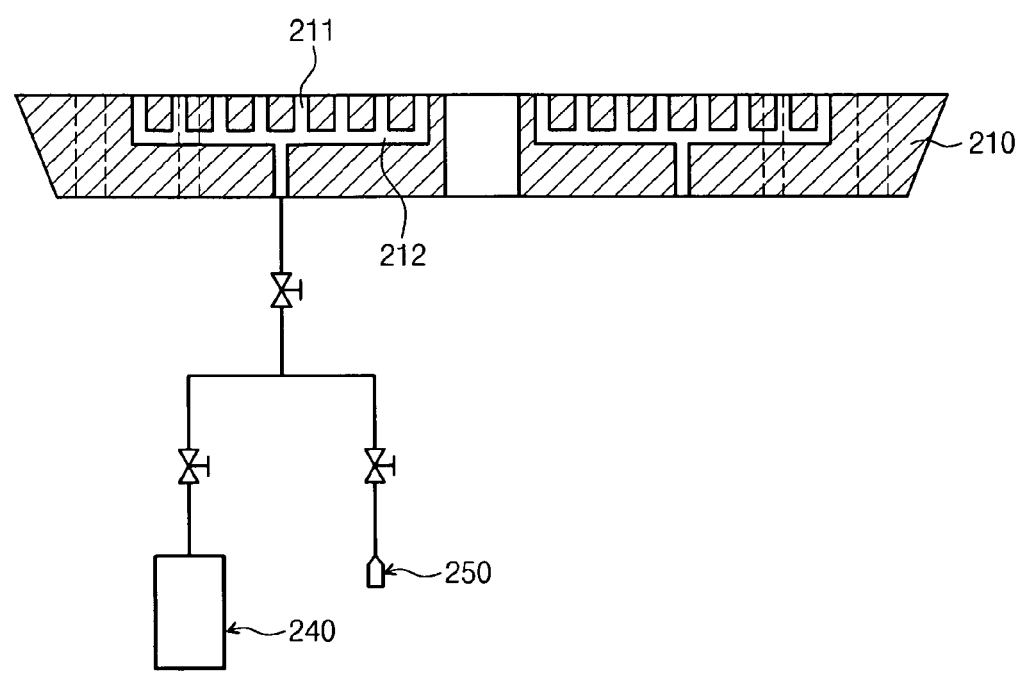
FIG. 5 is an enlarged view illustrating a vacuum plate of FIG. 3.

Referring to FIG. 5, a plurality of vacuum absorption holes may be defined in a top surface of the vacuum plate 210. Vacuum lines 212 connecting the vacuum absorption holes to each other are disposed inside the vacuum plate 210. A suction member 240 and a gas supply member 250 may be connected to the vacuum lines 212. The suction member 240 provides a negative pressure to the vacuum lines 212 to vacuum-absorb the substrate W. The gas supply member 250 supplies a gas to the vacuum lines 212 to prevent the cleaning liquid from being introduced into the vacuum absorption holes 211 in a state where the substrate W is upwardly spaced from the vacuum plate 210 to perform the cleaning process. An inert gas such as a nitrogen gas may be used as the gas.

A plurality of through holes 213 and 214 is defined in an edge region of the vacuum plate 210. Chuck members 215 and 216 for clamping the substrate W are inserted into the holes 213 and 214. The chuck members 215 and 216 include supporting pins 215 and chucking pins 216. The supporting pins 215 are arranged in a predetermined pattern to support the bottom surface of the substrate W. The chucking pins 216 are disposed outside the supporting pins 216 to support a lateral surface of the substrate W.

The driving member 260 moves the chuck members 215 and 216 upward and downward to support the substrate W loaded on the vacuum plate 210 in a state the substrate is upwardly spaced from the vacuum plate 210.

The driving member 260 includes upper magnet members 262a and 262b, lower magnet members 264a and 264b and linear driving units 266a and 266b.

The upper magnet members 262a and 262b include a first upper magnet member 262a coupled to the supporting pins 215 and a second upper magnet member 262b coupled to the chucking pins 216. The lower magnet members 264a and 264b include a first lower magnet member 264a disposed below the first upper magnet member 262a and a second lower magnet member 264b disposed below the second upper magnet member 262b. The first upper magnet member 262a and the first lower magnet member 264a include magnets 263a and 265a, respectively. Here, magnetic poles of the magnets 263a and 265a are oriented to form a magnetic repulsive force therebetween. Also, the second upper magnet member 262b and the second lower magnet member 264b include magnets 263b and 265b, respectively. Here, magnetic poles of the magnets 263b and 265b are oriented to form a magnetic repulsive force therebetween. The first and second upper magnet members 262a and 262b and the first and second lower magnet members 264a and 264b may have a ring shape surrounding the rotation shaft 220.

The linear driving units 266a and 266b include a first linear driving unit 266a vertically moving the first lower magnet member 264a and a second linear driving unit 266b vertically moving the second lower magnet member 264b.

The cleaning unit 330 is inserted into hollow regions of the vacuum plate 210, the rotation shaft 220, and the rotation driving part 230. The cleaning unit 330 may be a cleaning liquid supply member configured to supply the cleaning liquid to the bottom surface of the substrate W upwardly spaced from the vacuum plate 210. The cleaning unit 330 may be referred to as a back nozzle assembly according to claims.

The cleaning unit 300 may be vertically and linearly moved by a back nozzle driving unit 332. When the bottom surface of the substrate W is cleaned, the cleaning unit 330 may be moved upward by the back nozzle driving unit 332 to protrude from the top surface of the vacuum plate 210. When the top surface of the substrate W is polished, the cleaning unit 330 may be moved downward by the back nozzle driving unit 332 to retreat into the vacuum plate 210.

As shown in FIG. 3, when the substrate polishing process is performed, the chuck members 215 and 216 descend by the driving member 260 and the substrate is supported by the vacuum plate 210. As shown in FIG. 4, when the substrate post-cleaning process is performed, the chuck members 215 and 216 ascend by the driving member 260 to support the substrate W in the state where the substrate W is upwardly spaced from the vacuum plate 210.

When the substrate W is loaded into an upper region of the vacuum plate 210 by a transfer robot (not shown), the first linear driving unit 266a lifts the first lower magnet member 264. The first lower magnet member 264a lifts the first upper magnet member 262a by the magnetic repulsive force therebetween. As a result, the supporting pins 215 ascend to support the loaded substrate W. When the substrate W is transferred to the supporting pins 215, the first lower magnet member 264a descends by the first linear driving unit 266a. As a result, the first upper magnet member 262a and the supporting pins 215 descend to load the substrate W on the vacuum plate 210.

When the substrate W is loaded on the vacuum plate 210, the suction member 240 applies the negative pressure to the vacuum lines 212 to suction air between the substrate W and the vacuum plate 210 through the vacuum absorption holes 211. Thus, the substrate W is vacuum-absorbed onto the vacuum plate 210. A polishing head 420 that will be described later is moved above the substrate W to perform the substrate polishing process using a polishing pad 423 mounted on the polishing head 420.

After the polishing process is performed, the post-cleaning process is performed on the top and bottom surfaces of the substrate W. The first linear driving unit 266a lifts the first lower magnet member 264a. The first lower magnet member 264a lifts the first upper magnet member 262a by the magnetic repulsive force therebetween. As a result, the supporting pins 215 ascend to upwardly space the substrate W from the vacuum plate 210. At this time, the vacuum plate 210 may be rotated at a relatively lower speed when compared to that of the polishing process or stopped.

Thereafter, the second linear driving unit 266b lifts the second lower magnet member 264b. The second lower magnet member 264b lifts the second upper magnet member 262b by the magnetic repulsive force therebetween. As a result, the chucking pins 216 ascend to support the lateral surface of the substrate W. When the lateral surface of the substrate W is supported by the chucking pins 216, the vacuum plate may be accelerated to a process speed for the cleaning process.

In this state, the cleaning unit 310 supplies the cleaning liquid to the top surface of the substrate W, and the cleaning unit 320 applies supersonic waves to the cleaning liquid supplied to the top surface of the substrate W to clean the top surface of the substrate W. At the same time, the cleaning unit 330 supplies the cleaning liquid to the bottom surface of the substrate W to clean the bottom surface of the substrate W. When the substrate cleaning process is performed, the gas supply member 250 may supply a gas to the vacuum absorption holes 211 to prevent the cleaning liquid from being introduced into the vacuum absorption holes 211 of the vacuum plate 210. Also, when the cleaning process is performed on the bottom surface of the substrate W, the cleaning unit 330 (this may be referred to as the back nozzle assembly) may spray the cleaning liquid in a state where the cleaning unit 330 is moved so that it protrudes from the vacuum plate 210.

Next, the polishing unit 400 configured to polish the substrate fixed by the substrate supporting unit 200 including the above-described components will be described.

Figure 6:
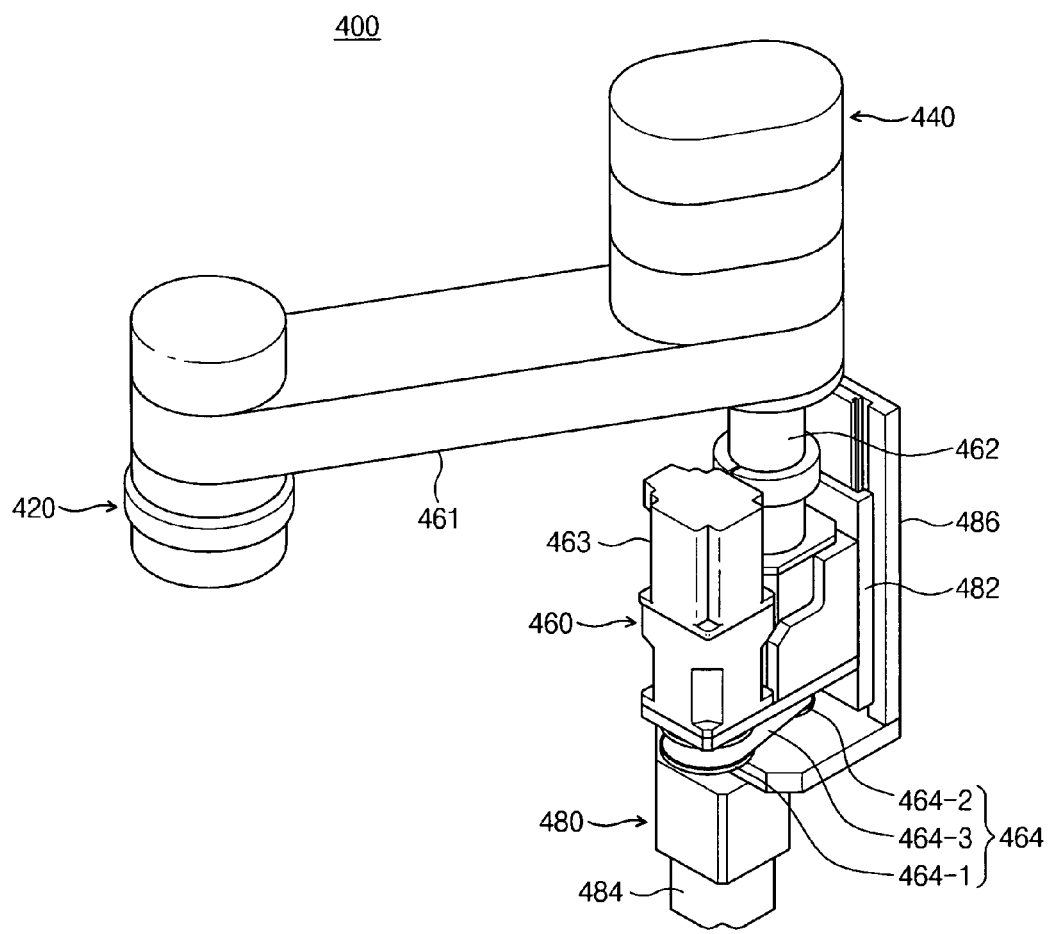
FIG. 6 is a perspective view illustrating a polishing unit of FIG. 1.
Figure 7:
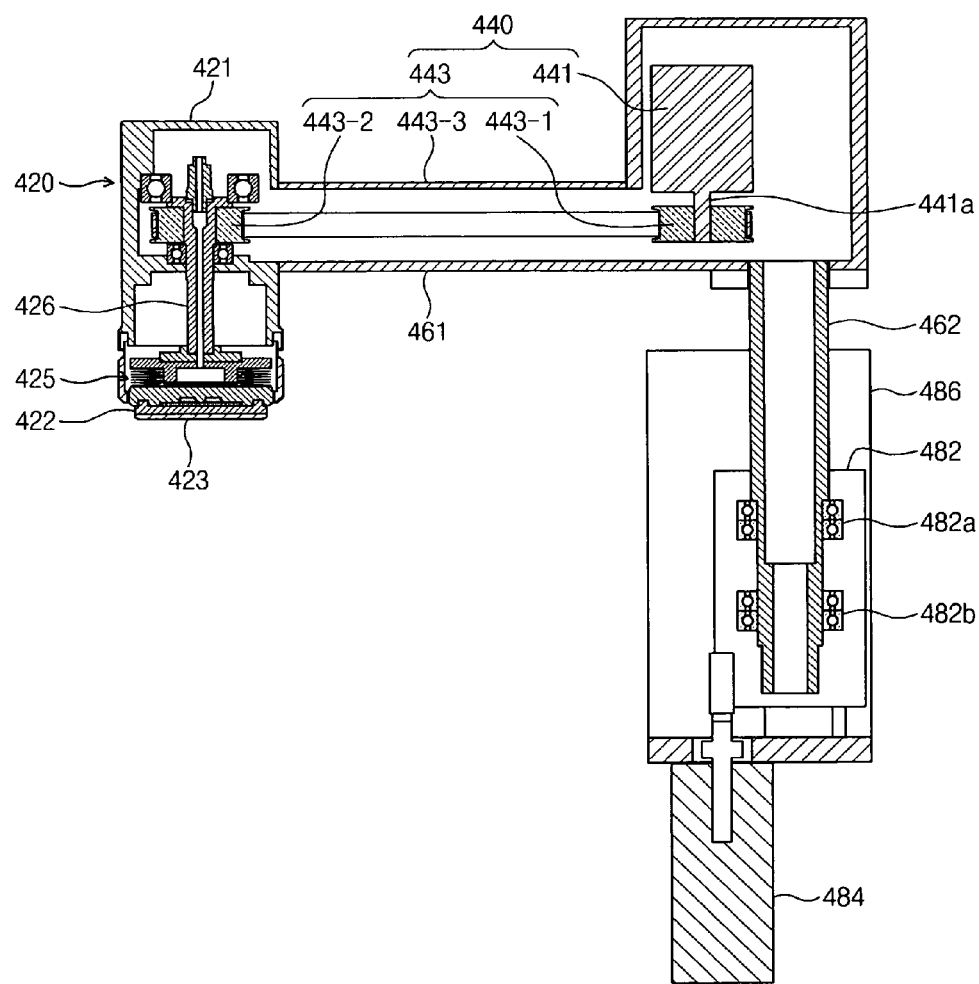
FIG. 7 is a side sectional view illustrating the polishing unit of FIG. 6.
Figure 8:
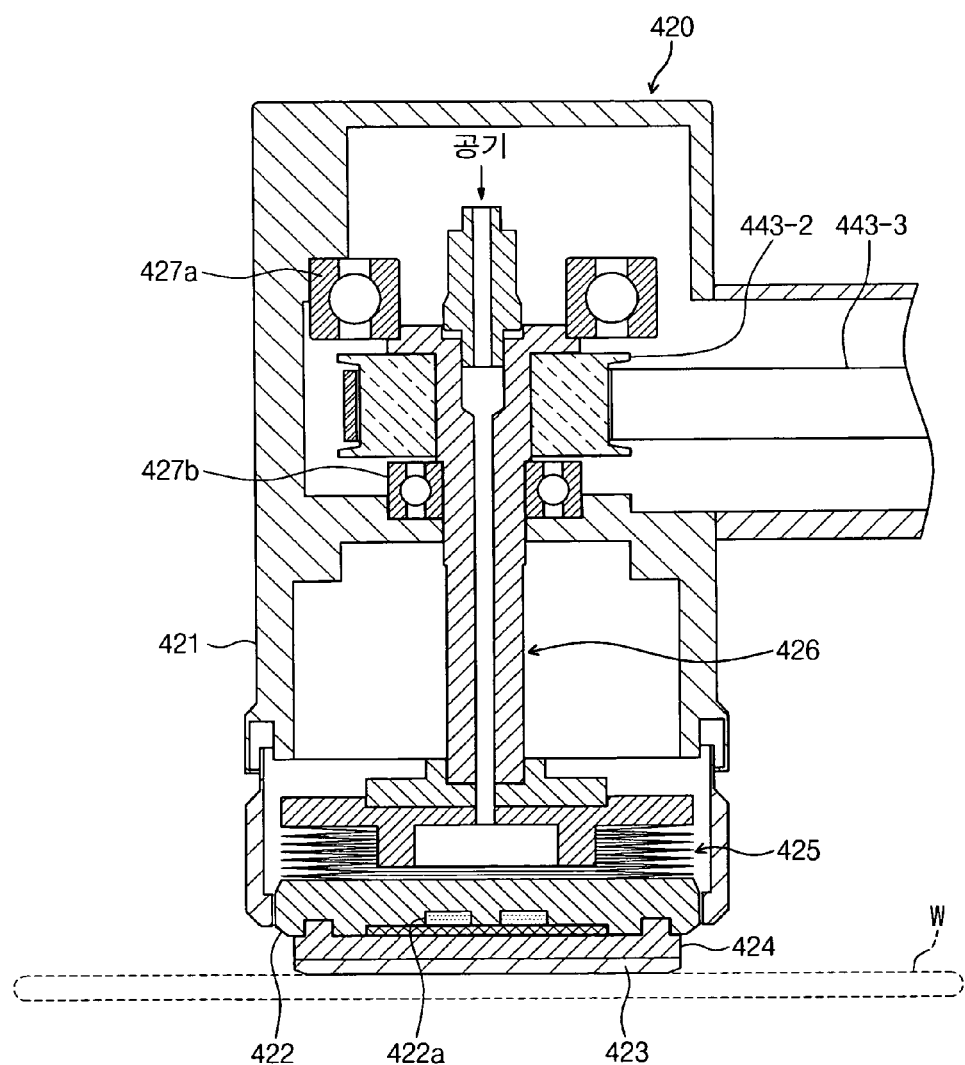
FIG. 8 is an enlarged view illustrating a polishing head of FIG. 7.

FIG. 6 is a perspective view illustrating a polishing unit of FIG. 1, FIG. 7 is a side sectional view illustrating the polishing unit of FIG. 6, and FIG. 8 is an enlarged view illustrating a polishing head of FIG. 7.

The polishing process for chemically and mechanically planarizing the surface of the substrate is performed using the polishing unit 400. Referring to FIGS. 6 through 8, the polishing unit 400 includes the polishing head 420 and first, second, and third driving members 440, 460, and 480 for driving the polishing head 420 according to operation modes. The polishing pad 423 is mounted on the polishing head 420 for polishing the substrate. During the polishing process, the first driving member 440 rotates the polishing pad 423. The second driving member 460 moves the polishing head 420 on a horizontal plane to swing the polishing head 420. The third driving member 480 vertically moves the polishing head 420.

The polishing head 420 includes a cylindrical housing 421 having an opened lower portion. A plate-shaped polishing pad holder 422 is disposed at the opened lower portion of the housing 421. The polishing pad 423 is coupled to a bottom surface of the polishing pad holder 422. The polishing pad 423 may be attached to one surface of a plate 424 formed of a metal material. A magnet member 422a may be built in the polishing pad holder 422 to apply a magnetic force to the metal plate 424 such that the other surface of the metal plate 424 is detachably coupled to the polishing pad holder 422.

A bellows 425 is disposed on a top surface of the polishing pad holder 422. The bellows 425 may be vertically extended or contracted by an air pressure applied from a pneumatic member 426. The bellows 425 may be extended to allow the polishing pad 423 to be closely attached to the substrate W during the polishing process. When the polishing process is performed in a state where the polishing pad 423 is closely attached to the substrate W, the surface of the substrate W may be polished more uniformly and efficiently.

The pneumatic member 426 is connected to an upper portion of the bellows 425. The pneumatic member 426 may include a shaft member having a hollow shaft shape. The pneumatic member 426 may be vertically disposed in a longitudinal direction.

The pneumatic member 426 is rotatably supported by bearings 427a and 427b. An air line (not shown) may be connected to the pneumatic member 426 to supply air to the pneumatic member 426. A valve (not shown) may be disposed in the air line to close and open the air line, and a flow meter (not shown) may be disposed in the air line to control the flow rate of the air supplied through the air line. The above-described structures are well known to one of ordinary skill in the related art, and thus detailed descriptions thereof will be omitted.

During the polishing process, the first driving member 440 rotates the polishing pad 423. The first driving member 440 includes a first driving motor 441 providing a rotation power and a first belt-pulley assembly 443 transmitting the rotation power of the first driving motor 441 to the polishing pad 423. The first belt-pulley assembly 443 may include a first driving pulley 443-1, a first driven pulley 443-2, and a first belt 443-3. The first driving pulley 443-1 is disposed on a rotation shaft 411a of the first driving motor 441. The first driven pulley 443-2 is disposed on an outer surface of the hollow shaft-shaped pneumatic member 426. The first belt 443-3 is wound around the first driving pulley 443-1 and the first driven pulley 443-2. Here, the first driving motor 441 at which the first driving pulley 443-1 is disposed may be disposed inside an end of a swing arm 461 (described later) of the second driving member 460. The first belt 443-3 may be wound around the first driving pulley 443-1 and the first driven pulley 443-2 through the inside of the swing arm 461 along the longitudinal direction of the swing arm 461.

Figure 9A:
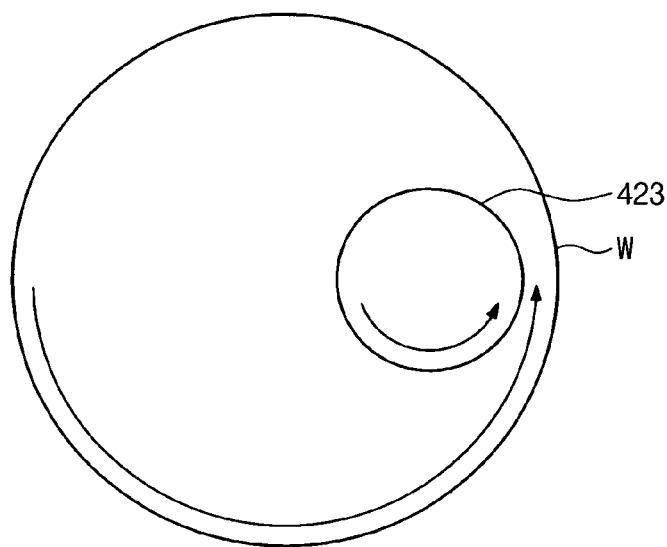
FIGS. 9A and 9B are views of an exemplary polishing process using a polishing pad.
Figure 9B:
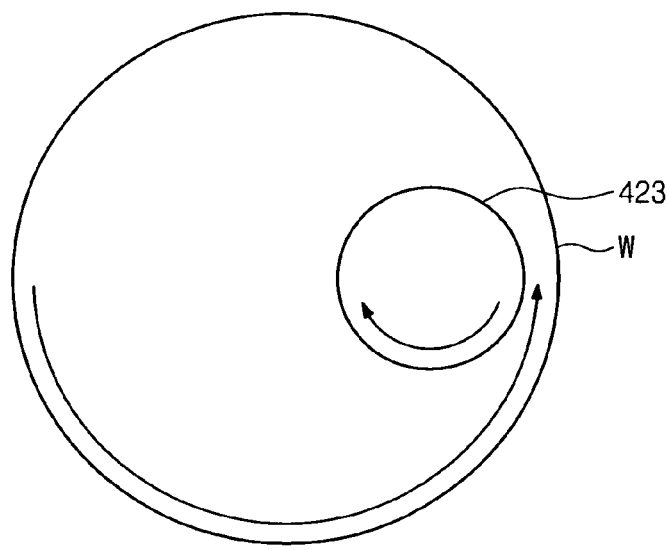

The rotation power of the first driving motor 441 is transmitted to the pneumatic member 426 through the first belt-pulley assembly 443 to rotate the pneumatic member 426. As the pneumatic member 426 is rotated, the bellows 425, the polishing pad holder 422, and the polishing pad 423 that are sequentially assembled under the pneumatic member 426 are rotated. At this time, the first driving motor 441 of the first driving member 440 may selectively provide a rotation power in a clockwise or counterclockwise direction. Thus, as shown in FIGS. 9A and 9B, the polishing pad 423 may be rotated in the clockwise or counterclockwise direction. Since the rotation direction of the polishing pad 423 may be varied in the clockwise or counterclockwise direction, the substrate W may be selectively polished while the polishing pad 423 is rotated in the same direction as the rotation direction of the substrate W or in a direction opposite to the rotation direction of the substrate W.

The second driving member 460 moves the polishing head 420 on a horizontal plane to swing the polishing head 420 on the substrate W. The second driving member 460 includes the swing arm 461, a vertical arm 462, a second driving motor 463, and a second belt-pulley assembly 464. An end of the swing arm 461 is horizontally coupled to a side of the housing 421 of the polishing head 420, and the vertical arm 462 is vertically coupled to the other end of the swing arm 461 from a downward direction of the swing arm 461. The second driving motor 463 provides a rotation power to the vertical arm 462 through the second belt-pulley assembly 464. The second belt-pulley assembly 464 may include a second driving pulley 464-1, a second driven pulley 464-2, and a second belt 464-3. The second driving pulley 464-1 is disposed at a rotation shaft of the second driving motor 463. The second driven pulley 464-2 is disposed on an outer surface of the vertical arm 462. The second belt 464-3 is wound around the second driving pulley 464-1 and the second driven pulley 464-2.

The rotation power of the second driving motor 463 is transmitted to the vertical arm 462 through the second belt-pulley assembly 464 to rotate the vertical arm 462. Thus, as the vertical arm 462 is rotated, the swing arm 461 is swung about the vertical arm 462. As a result, the polishing head 420 on which the polishing pad 423 is mounted is moved along a circularly curved trace.

The third driving member 480 vertically moves the polishing head 420. The third driving member 480 includes a supporting block 482, a guide member 484, and a linear driving unit 486. The supporting block 482 supports the vertical arm 462, and the vertical arm 462 is rotatably supported by bearings 482a and 482b. The linear driving unit 486 provides a driving power for linearly moving the supporting block 482 upward and downward. A linear driving member such as a cylinder member or a linear motor may be used as the linear driving unit 486. The guide member 484 guides a linear movement of the supporting block 482.

The linear driving power of the linear driving unit 486 is transmitted to the supporting block 482. As the vertical arm 462 supported by the supporting block 482 is vertically moved together with the supporting block 482, the polishing head 420 on which the polishing pad 423 is mounted is moved upward and downward.

In case where the polishing process is repeatedly performed using the polishing pad 423, the surface of the polishing pad 423 should be periodically polished to adjust the surface roughness of the polishing pad 423. For this, as shown in FIG. 1, the pad conditioning unit 500 is provided at a position adjacent to the polishing unit 400 within the process chamber 10.

Figure 10:
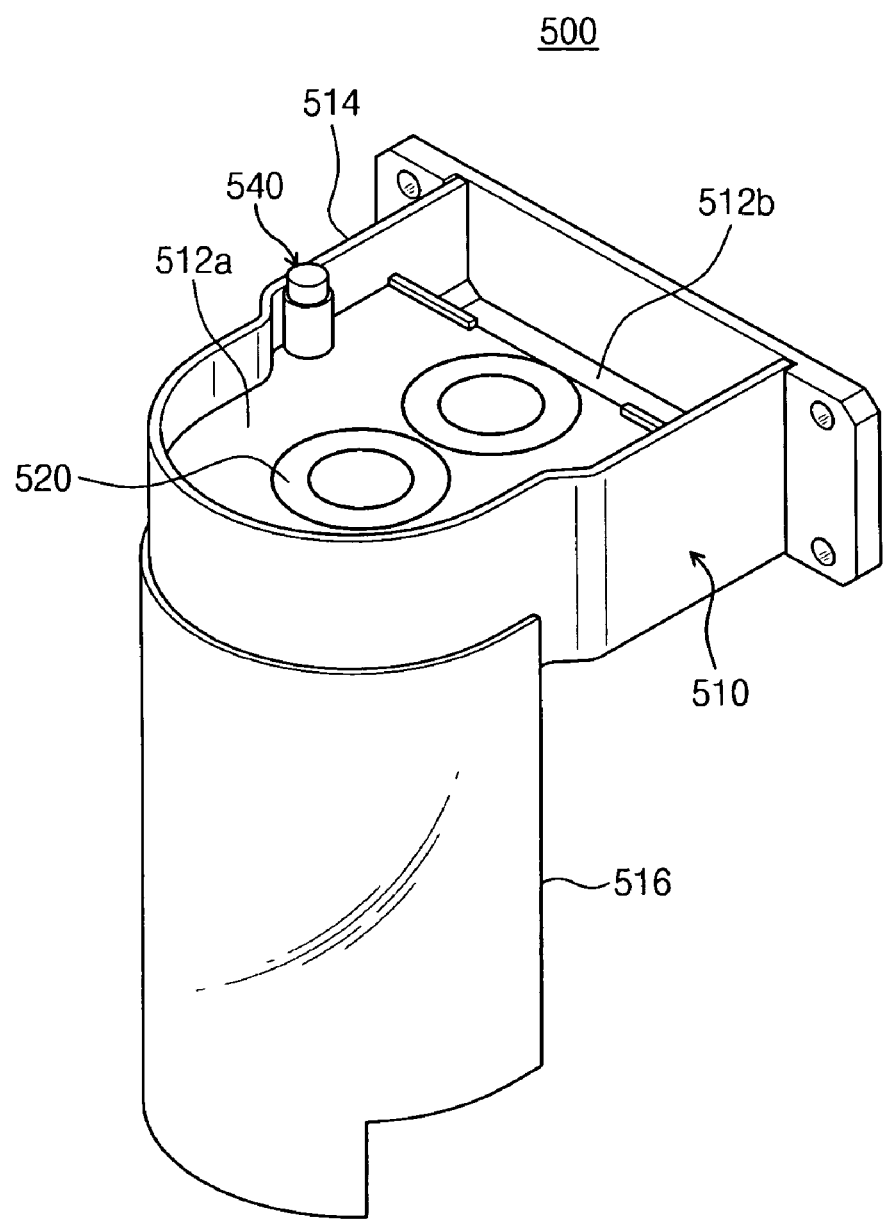
FIG. 10 is a perspective view illustrating a pad conditioning unit of FIG. 1.
Figure 11:
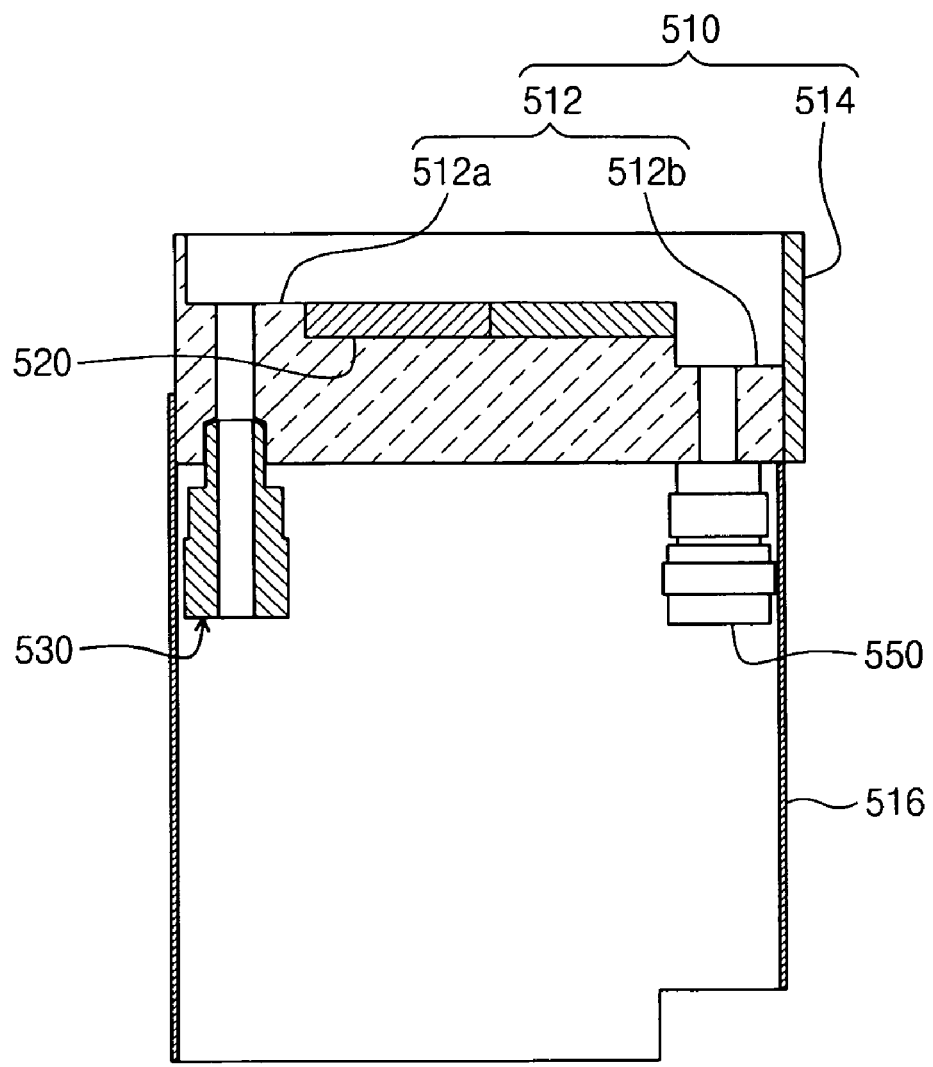
FIG. 11 is a side sectional view illustrating the pad conditioning unit of FIG. 10.
Figure 12:
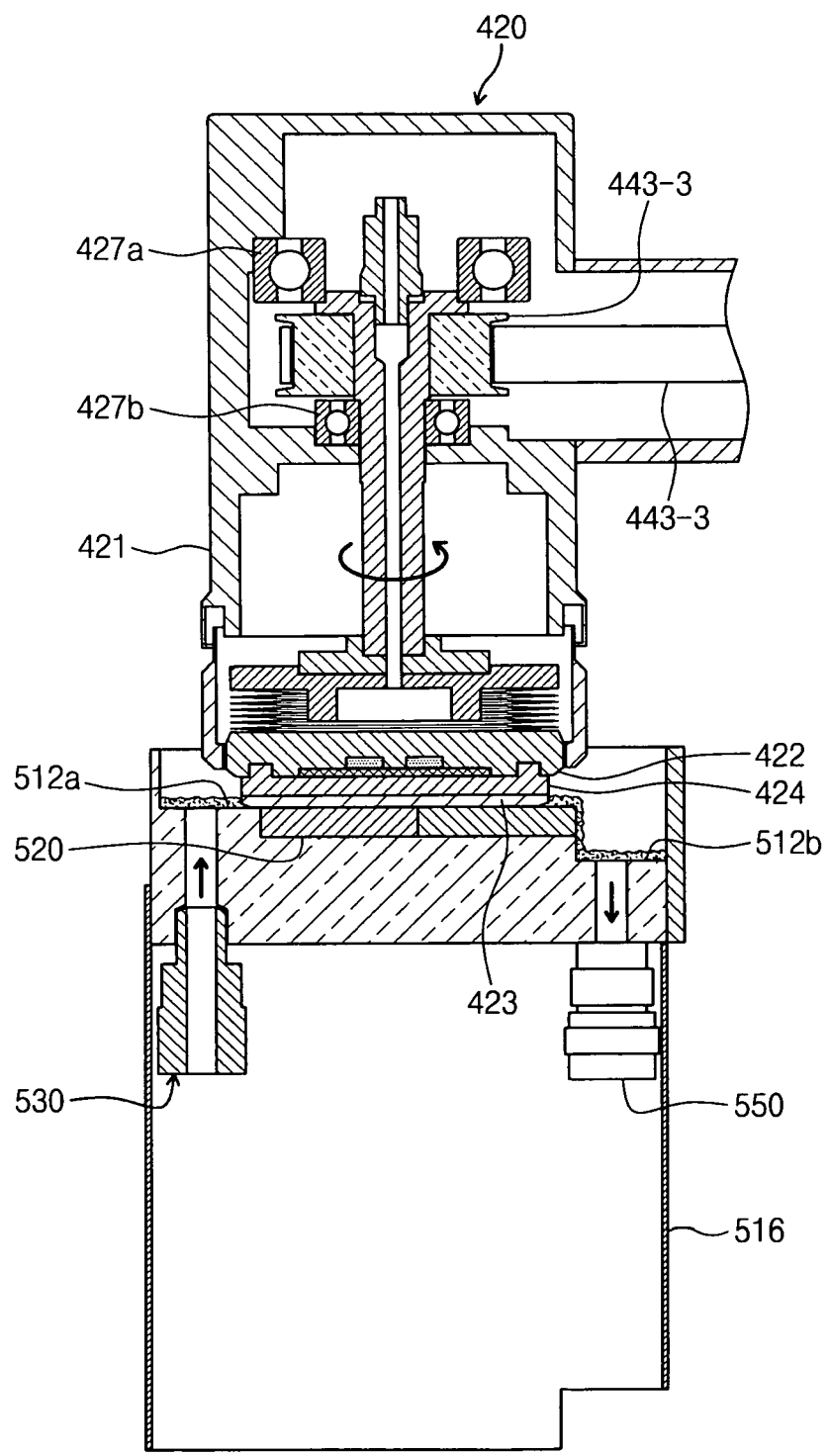
FIG. 12 is a sectional view illustrating an operational state of the pad conditioning unit.
Figure 13:
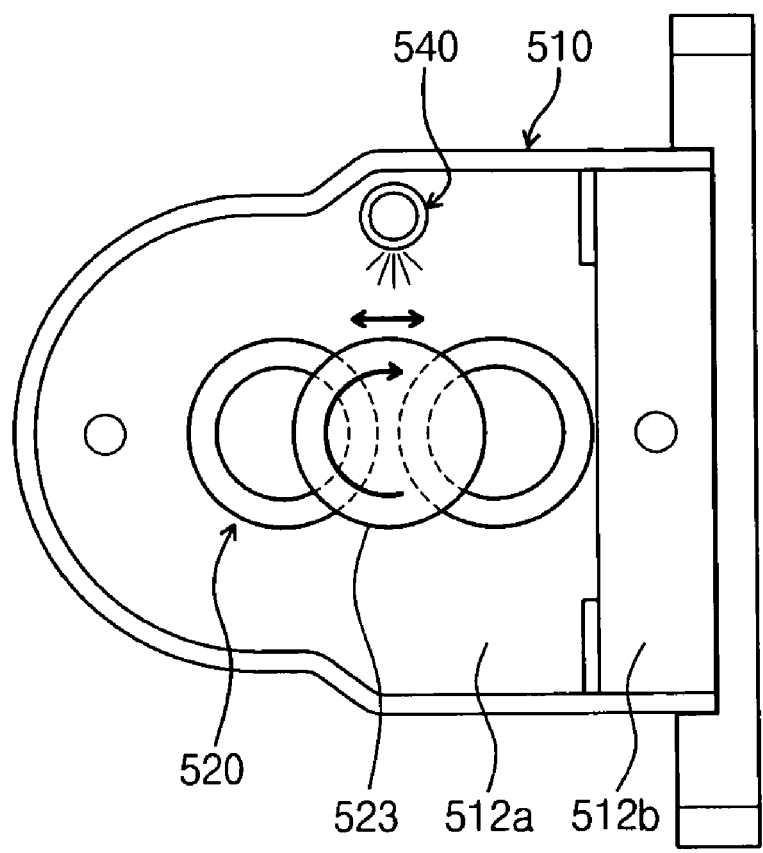
FIG. 13 is a plan view illustrating an operational state of the pad conditioning unit.

FIG. 10 is a perspective view illustrating a pad conditioning unit of FIG. 1, and FIG. 11 is a side sectional view illustrating the pad conditioning unit of FIG. 10. FIGS. 12 and 13 are views illustrating an operational state of the pad conditioning unit.

Referring to FIGS. 10 through 13, the pad conditioning unit 500 includes a process bath 510 having a bucket shape with an opened upper portion. An end of the polishing head 420 on which the polishing pad is mounted is received into the process bath 510. The process bath 510 includes a bottom wall 512 and a sidewall 514 extending upward from an edge of the bottom wall 512. A supporting frame 516 is disposed at a lower portion of the bottom wall 512. The bottom wall 512 of the process bath 510 may include a first bottom wall 512a having a first height and a second bottom wall 512b having a second height lower than the first height.

A diamond conditioner 520 is disposed in the first bottom wall 512a of the process bath 510. The diamond conditioner 520 contacts the polishing pad 423 to polish the surface of the polishing pad 423. The diamond conditioner 520 may have a ring or circular shape. The diamond conditioner 520 may have a size corresponding to that of the first bottom wall 512a of the process bath 510. Alternatively, a plurality of diamond conditioners 520, each having a size smaller than that of the first bottom wall 512a, may be provided.

First and second deionized water supply members 530 and 540 are disposed in the process bath 510 to supply deionized water to the first bottom wall 512a of the process bath 510 for removing foreign substances generated while the polishing pad 423 is polished. The first deionized water supply member 530 is connected to the first bottom wall 512a to supply the deionized water to the inside of the process bath 510 through the first bottom wall 512a, and the second deionized water supply member 540 is disposed at a side of the process bath 510 to supply the deionized water from the upper side of the first bottom wall 512a toward the first bottom wall 512a. The deionized water supplied from the first and second deionized water supply members 530 and 540 to the process bath 510 removes the foreign substances while the deionized water flows along the first bottom wall 512a. Thereafter, the deionized water containing the foreign substances flows to the second bottom wall 512b stepped at a height lower than that of the first bottom wall 512a. The deionized water flowing to the second bottom wall 512b is discharged to the outside through a drain member 550 connected to the second bottom wall 512b.

As shown in FIG. 12, the polishing pad 423 is polished in a state where the polishing head 420 is received in the process bath 510. At this time, the third driving member (see reference numeral 480 of FIG. 6) vertically moves the polishing head 420 received in the process bath 510 to allow the polishing pad 423 to contact the diamond conditioner 520. In this state, as shown in FIG. 13, the first driving member (see reference numeral 440 of FIG. 6) rotates the polishing pad 423, and the second driving member (see reference numeral 460 of FIG. 6) moves the polishing head 420 on the horizontal plane to scan the polishing pad 423 on the diamond conditioner 520. At this time, the first and second deionized water supply members 530 and 540 supply the deionized water to the process bath 510 to remove the foreign substances generated while the polishing pad 423 is polished. Thereafter, the deionized water is discharged to the outside through the drain member 550.

According to the inventive concept, in a state where the substrate is supported by the substrate supporting unit in the single wafer type substrate manner, the polishing process on the top surface of the substrate and the post-cleaning process on the top and bottom surfaces of the substrate may be sequentially performed.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A substrate supporting unit, comprising:
   a vacuum plate vacuum-absorbing a substrate;
   chuck members inserted into holes passing through the vacuum plate, the chuck members include supporting pins supporting a bottom surface of the substrate and chucking pins supporting a lateral surface of the substrate; and
   a driving member vertically moving the chuck members to support the substrate placed on the vacuum plate in a state where the substrate is spaced upwardly from the vacuum plate, the driving member includes:
      an upper magnet member coupled to the chuck members;
      a lower magnet member in which a magnetic pole thereof is oriented such that a magnetic repulsive force acts between the upper and lower magnet members, the lower magnet member being disposed below the upper magnet member to face each other; and
      a linear driving unit vertically moving the lower magnet member,
   wherein the upper magnet member includes a first upper magnet member coupled to the supporting pins and a second upper magnet member coupled to the chucking pins, and
   wherein the lower magnet member includes:
      a first lower magnet member in which a magnetic pole thereof is oriented such that a magnetic repulsive force acts between the first upper and lower magnet members, the first lower magnet member being disposed below the first upper magnet member; and
      a second lower magnet member in which a magnetic pole thereof is oriented such that a magnetic repulsive force acts between the second upper and lower magnet members, the second lower magnet member being disposed below the second upper magnet member, and wherein the linear driving unit includes:
      a first linear driving unit vertically moving the first lower magnet member; and
      a second linear driving unit vertically moving the second lower magnet member.

2. The substrate supporting unit of claim 1, wherein each of the first and second upper magnet members and the first and second lower magnet members has a ring shape.

3. The substrate supporting unit of claim 1, wherein a plurality of vacuum absorption holes is defined in a top surface of the vacuum plate, and vacuum lines connecting the vacuum absorption holes to each other are disposed inside the vacuum plate,
   wherein the substrate supporting unit further comprises:
   a suction member providing a negative pressure to the vacuum lines to vacuum-absorb the substrate; and
   a gas supply member supplying a gas to the vacuum lines to prevent a foreign substance from being introduced into the vacuum absorption holes in a state where the substrate is upwardly spaced from the vacuum plate.

4. The substrate supporting unit of claim 1, further comprising:
   a hollow-type rotation driving unit rotating the vacuum plate; and
   a back nozzle assembly inserted into a hollow portion of the rotation driving unit, the back nozzle assembly spraying a cleaning liquid onto a bottom surface of the substrate upwardly spaced from the vacuum plate.

5. The substrate supporting unit of claim 4, further comprising a back nozzle driving unit vertically moving the back nozzle assembly such that the back nozzle assembly protrudes from a top surface of the vacuum plate.

6. A single wafer type substrate polishing apparatus, comprising:
   a process chamber;
   a substrate supporting unit disposed inside the process chamber, the substrate supporting unit supporting a substrate;
   a polishing unit polishing the substrate supported by the substrate supporting unit; and
   a cleaning unit cleaning the substrate supported by the substrate supporting unit,
   wherein the substrate supporting unit comprises:
   a vacuum plate vacuum-absorbing the substrate;
   chuck members inserted into holes passing through the vacuum plate, the chuck members include supporting pins supporting a bottom surface of the substrate and chucking pins supporting a lateral surface of the substrate; and a driving member vertically moving the chuck members to support the substrate placed on the vacuum plate in a state where the substrate is spaced upwardly from the vacuum plate, the driving member includes:
   an upper magnet member coupled to the chuck members;
   a lower magnet member in which a magnetic pole thereof is oriented such that a magnetic repulsive force acts between the upper and lower magnet members, the lower magnet member being disposed below the upper magnet member to face each other; and
   a linear driving unit vertically moving the lower magnet member,
wherein the upper magnet member includes a first upper magnet member coupled to the supporting pins and a second upper magnet member coupled to the chucking pins, and
wherein the lower magnet member includes:
   a first lower magnet member in which a magnetic pole thereof is oriented such that a magnetic repulsive force acts between the first upper and lower magnet members, the first lower magnet member being disposed below the first upper magnet member; and
   a second lower magnet member in which a magnetic pole thereof is oriented such that a magnetic repulsive force acts between the second upper and lower magnet members, the second lower magnet member being disposed below the second upper magnet member,
wherein the linear driving unit includes:
   a first linear driving unit vertically moving the first lower magnet member; and
   a second linear driving unit vertically moving the second lower magnet member.

7. The single wafer type substrate polishing apparatus of claim 6, wherein the cleaning unit comprises:
   a first cleaning unit disposed at a side of the substrate supporting unit, the first cleaning unit supplying a cleaning liquid onto a top surface of the substrate; and
   a second cleaning unit inserted into a hollow portion of a hollow-type rotation driving unit rotating the vacuum plate, the second cleaning unit supplying a cleaning liquid onto a bottom surface of the substrate.

8. The single wafer type substrate polishing apparatus of claim 7, further comprising a driving member vertically moving the second cleaning unit such that the second cleaning unit protrudes from a top surface of the vacuum plate.

9. The single wafer type substrate polishing apparatus of claim 7, further comprising a gas supply member supplying a gas to a vacuum absorption holes to prevent the cleaning liquid from being introduced into the vacuum absorption holes defined in the vacuum plate during a substrate cleaning process.

10. A method of polishing a substrate using an apparatus of claim 6, the method comprising:
   vacuum-absorbing the substrate onto the vacuum plate to polish a top surface of the substrate;
   lifting the chuck members to support the polished substrate placed on the vacuum plate in a state where the substrate is upwardly spaced from the vacuum plate; and
   supplying a cleaning liquid to the polished substrate to clean the substrate.

11. The method of claim 10, wherein the chuck members comprise supporting pins supporting a bottom surface of the substrate, and when the supporting pins ascend, the vacuum plate is rotated at a relatively lower speed when compared to that of the substrate polishing process or stopped.

12. The method of claim 11, wherein the chuck members further comprise chucking pins supporting a lateral surface of the substrate, the chucking pins ascend to support a lateral surface of the substrate supported by the supporting pins, and the vacuum plate is accelerated at a process speed.

13. The method of claim 10, wherein the cleaning liquid is supplied to the top surface and a bottom surface of the polished substrate upwardly spaced from the vacuum plate to clean the top and bottom surfaces of the substrate at the same time.

14. The method of claim 13, wherein, when the bottom surface of the substrate is cleaned, the back nozzle assembly is vertically moved such that the back nozzle assembly spraying the cleaning liquid protrudes from a top surface of the vacuum plate.

15. The method of claim 13, wherein, when the cleaning process is performed on the substrate, a gas is supplied to the vacuum absorption holes to prevent the cleaning liquid from being introduced into the vacuum absorption holes of the vacuum plate.

* * * * *